US006683510B1

(12) United States Patent
Padilla

(10) Patent No.: US 6,683,510 B1
(45) Date of Patent: Jan. 27, 2004

(54) ULTRA-WIDEBAND PLANAR COUPLED SPIRAL BALUN

(75) Inventor: Jose G. Padilla, South Gate, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/172,164

(22) Filed: Aug. 8, 2002

(51) Int. Cl.[7] .............................. H01P 5/10; H03H 5/00
(52) U.S. Cl. ............................................ 333/25; 333/26
(58) Field of Search ..................... 333/25, 26; 336/200, 336/232

(56) References Cited

U.S. PATENT DOCUMENTS

| | | | | |
|---|---|---|---|---|
| 5,061,910 A | | 10/1991 | Bouny | |
| 5,173,671 A | * | 12/1992 | Wendler et al. | 333/185 |
| 5,428,838 A | | 6/1995 | Chang et al. | |
| 5,428,840 A | | 6/1995 | Sadhir | |
| 5,819,169 A | | 10/1998 | Fudem | |
| 6,380,821 B1 | * | 4/2002 | Imbornone et al. | 333/25 |
| 2003/0117227 A1 | * | 6/2003 | Escalera et al. | 333/26 |

OTHER PUBLICATIONS

K. S. Ang, et al., "A Compact MMIC Balun Using Spiral Transformers," IEEE Asia Pacific Microwave Conference, Dec. 1999.

Yeong J. Yoon, et al., "Modeling of Monolithic RF Spiral Transmission–Line Balun," IEEE Transactions on Microwave Theory and Techniques, vol. 49, No. 2, Feb. 2001.

* cited by examiner

*Primary Examiner*—Robert Pascal
*Assistant Examiner*—Dean Takaoka
(74) *Attorney, Agent, or Firm*—Ronald M. Goldman

(57) ABSTRACT

A coupled transmission line balun construction employs two pairs of planar interleaved spiral coils (3, 5 & 7, 9) formed on an electrically insulating or semi-insulating substrate (11) defining a planar structure. One coil in each pair is connected in series to define the input transmission line of the balun, with one end (8) of that transmission line being open circuit. The balun provides an ultra-wide bandwidth characteristic in the frequencies of interest for MMIC devices, is fabricated using the same techniques employed with fabrication of MMIC devices, and is of a physical size that lends itself to application within MMIC devices.

17 Claims, 3 Drawing Sheets

| Freq (GHz) | Rel. Phase (Deg.) | Rel. Mag (dB) |
|---|---|---|
| 12.00 | 178.97 | 0.51 |
| 12.50 | 178.94 | 0.44 |
| 13.00 | 178.79 | 0.40 |
| 13.50 | 178.80 | 0.33 |
| 14.00 | 178.69 | 0.29 |
| 14.50 | 178.74 | 0.24 |
| 15.00 | 178.70 | 0.20 |
| 15.50 | 178.78 | 0.15 |
| 16.00 | 178.81 | 0.13 |
| 16.50 | 178.93 | 0.09 |
| 17.00 | 179.05 | 0.08 |
| 17.50 | 179.22 | 0.05 |
| 18.00 | 179.41 | 0.05 |
| 18.50 | 179.66 | 0.04 |
| 19.00 | 179.91 | 0.05 |
| 19.50 | 180.26 | 0.05 |
| 20.00 | 180.58 | 0.08 |
| 20.50 | 181.03 | 0.15 |
| 21.00 | 181.42 | 0.15 |
| 21.50 | 181.98 | 0.20 |
| 22.00 | 182.46 | 0.26 |
| 22.50 | 183.13 | 0.33 |
| 23.00 | 183.71 | 0.43 |
| 23.50 | 184.60 | 0.53 |
| 24.00 | 185.43 | 0.65 |

ULTRA-WIDEBAND PLANAR COUPLED SPIRAL BALUN

FIELD OF THE INVENTION

This invention relates to high frequency transformer apparatus for coupling single ended high frequency transmission lines (e.g. unbalanced lines) to a pair of balanced transmission lines, commonly referred to as a balun, and, more specifically, to a planar form of balun for application in a monolithic microwave integrated circuit ("MMIC").

BACKGROUND OF THE INVENTION

In high frequency RF circuits it is common to convert or split a high frequency RF signal supplied over a two-wire transmission line into separate balanced signals, equal in power and out of phase by one hundred and eighty degrees, and allow the separate signals to propagate along separate transmission paths. Formed of two wires, one of which is connected to electrical ground, the two-wire transmission line (and, hence, the RF signal) is seen as unbalanced with respect to ground, while the latter two transmission paths (and the two derived signals) are balanced with respect to that ground. Such a conversion of unbalanced to balanced signals is often accomplished by a Balun transformer. Conversely, some implementations of Balun transformers also permit the reverse action, converting a balanced signal into an unbalanced pair. In general, a Balun transformer (generally referred to simply as a Balun) is either active or passive in character. The passive type does not require an external source of electrical power for operation; only the high-speed signals, RF, of interest are required for the conversion. Passive Baluns often possess bidirectional characteristics. That is the signals of interest may be either inputs or outputs to any of the ports of the Balun. The present invention relates to Baluns of the passive type and, more particularly, to Baluns used in the unbalanced to balanced direction that find typical application in mixer frequency downconverters for both the local oscillator ("LO") and RF signals.

Many forms of Baluns are known in the art. Examples of Balun structures are found in patents U.S. Pat. No. 5,428,838 to Chang et al, U.S. Pat. No. 5,819,169 To Faden, U.S. Pat. No. 5,061,910 to Bouny, and U.S. Pat. No. 5,428,840 to Sadir. Often the Balun is integrated within the structure of another active high frequency device, such as a ring mixer or star mixer. The mixer device in turn forms a component of a Microwave Monolithic Integrated circuit ("MMIC") device. MMIC devices by definition contain all the active and passive circuit elements and associated interconnections formed either in site on or within a semi-insulating semiconductor substrate or insulating substrate by one or more well known deposition processes.

Traditional coupled-line balun transformers implemented monolithically have typically been realized in a multi-substrate layered microstrip or stripline process or have been constructed in a manner unique to a particular application. Examples of the latter are the Star mixer described in the cited '838 Chang et al patent; and the high leakage and the intermodulation suppression ring mixer described in the cited '169 Faden patent. Multi-substrate layer processes are expensive, and may not be available or standard at every semiconductor foundry. As an advantage, the present invention does not require multi-substrate layer processes.

The '838 Chang et. al. patent illustrates a diode star mixer which incorporates an identical pair of coupled line baluns oriented at right angles to one another and which is capable of configuration in a MMIC circuit. Each balun is formed of coupled transmission line microstrips (FIG. 3). A straight center microstrip formed on a substrate of semiconductor material, such as Gallium Arsenide (dielectric constant 12.9), or on a substrate of insulating material, such as Alumina (dielectric constant 9.9), is bounded on both sides of the length thereof by two pairs of identical microstrips with one end of that center microstrip serving as an input and the other end being "open", that is, unconnected. One pair of the microstrips bounds essentially one-half of the length of the center microstrip and the other pair bounds essentially the remaining half of the length of the center microstrip. The outer ends of the two microstrips of each pair are connected to ground, while the inner ends of the two microstrips of each pair are electrically connected together to form first and second outputs. One end of the center microstrip serves as an input for the unbalanced line, while the remaining end of that microstrip remains open, that is, is not directly electrically connected to anything else.

In the practical embodiment of the star mixer illustrated and described in detail in the Chang patent, the balun is shown as an integral element of a dual balun structure in which the baluns are oriented perpendicular to one another and the center connectors of the two baluns are connected together where they criss-cross. The balun of the '838 Chang et al patent appears to offer a balun structure that is useful at those very high frequencies at which the length of the straight microstrip transmission lines remains practical. However, as one realizes, should the star mixer be designed for lower frequencies, such as approximately 2 GHz, the length of the transmission lines require a greater space, which, following the structure defined in the '838 Chang patent, is impractical for and could not be effectively implemented within a MMIC structure. As an advantage, the present invention is more compact in size than the baluns of the Chang patent and is practical in MMIC structures at those low frequencies. A Star or Ring mixer implemented with the present invention occupies significantly less real estate on the substrate than that of the '838 Chang patent at any range of frequency, and provides comparable performance. Because of the requirement for less space, as a further advantage, the present invention permits greater miniaturization of MMIC circuits than that of the Chang patent even at those higher frequencies at which the mixer of the Chang patent remains practical.

According to the Chang patent, coupled line baluns, the type found in the Chang patent and in the present invention, will generally perform poorly unless the coupled lines have high even-mode impedance and the even and odd mode phase velocities are closely matched. Inherent to the unique construction of the Balun of the Chang patent and to that of the present invention is that both Baluns are tolerant of low even-mode impedances. Due to that tolerance it is possible to use the baluns in the construction of Star and Ring mixers. When constructed on a high dielectric base or substrate, as is typically the case in MMIC applications, adequate even and odd mode phase velocity matching is also achieved.

Accordingly, an object of the invention is to provide a Balun construction that provides balanced anti-phase outputs over an ultra-wide frequency range;

A further object of the invention is to provide a Balun structure that for a given set of comparable performance parameters occupies less space than the prior art Baluns;

A still further object of the invention is to provide a planar physical construction for a balun that is of application within MMIC devices and may be scaled for use over various ranges of frequencies, as example, 3 to 6 GHz, 12 to 24 GHz and 20 to 40 GHz frequency ranges.

And a still further object of the invention is to provide a new Balun structure that is essentially planar in shape and may be fabricated on a single layer substrate, either as part of a MMIC device or separately.

BRIEF SUMMARY OF THE INVENTION

In accordance with the foregoing objects and advantages, the invention is characterized by two pairs of coupled microstrip spiral coils attached to the flat upper surface of an electrical insulating substrate with one pair of coils located side by side with the other pair. Each coil in a pair is interleaved with the other coil in the pair and is spaced from one another and the coils of the pair are electro-magnetically linked or coupled. The coils of one pair define a spiral of decreasing radius, the coils of the other pair define a spiral of increasing radius, and the one pair of coils is a mirror image of the other pair of coils. One coil in each pair is serially connected by an air bridge with one coil of the other pair to serve as series connected primary windings of the balun; and one end of the second coil in the foregoing series connected primary windings is open. An end of each of the remaining coils in each pair are connected to a common juncture, and is directly or indirectly grounded, while the remaining ends of the latter two coils define the balanced outputs of the balun transformer. Geometrically, the coils are typically realized in a circular or rectangular spiral configuration.

The present invention provides a coupled line balun that is multi-purpose, ultra-wideband, compact in size, planar, monolithic, and inexpensive. The invention is suitable for many applications, including as a component of microwave mixers, frequency multipliers and balanced amplifiers.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

DETAILED DESCRIPTION OF THE INVENTION

Figure 1:
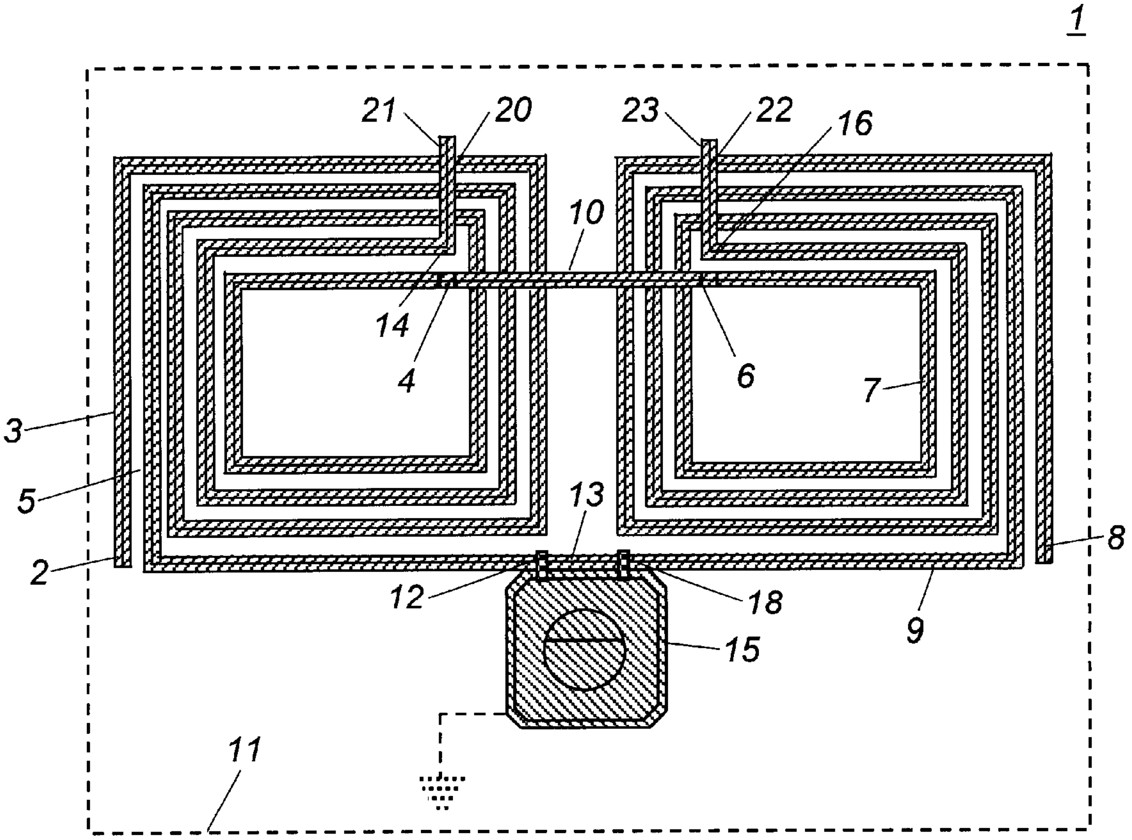
FIG. 1 is an embodiment of the invention illustrated in top view.

Reference is made to FIG. 1 illustrating a preferred embodiment of the Balun 1 in top view. The balun is formed of two pairs of electro-magnetically coupled and coiled microstrip transmission lines. The first pair contains spiral windings or coils 3 and 5, and the second pair contains spiral coils 7 and 9. Each of the spiral coils is fabricated as planar conductive metal traces on the flat upper surface of a substrate 11, the latter of which is only partially illustrated, suitably formed of electrical insulating material or semi-insulating material, such as the semi conductive material, Gallium Arsenide. Other suitable substrate materials include Indium Phosphide, Silicon, Silicon Germanium and the insulator material, Alumina. The coiled coupled transmission lines in each coil pair appear as interleaved "pancake"-shaped coils that are positioned side by side and are integrally attached to substrate 11. The underside surface of substrate 11 is coated or otherwise covered with a layer of metal, not illustrated, which forms a reference ground plane, and serves as electrical ground. A reference grounding mechanism may also be provided by including a coplanar metal ring on the top surface that extends about the entire structure. Such alternative grounding mechanism is often employed when the MMIC fabrication process lacks a via to backside substrate subprocess.

The turns of Coils 3 and 5 to the left in the figure coil wind about a center in parallel in a clockwise direction in a spiral of decreasing radius with the turns of the individual coils being interleaved and spaced apart on the substrate. The turns of coils 7 and 9 wind about another center in parallel in a counter-clockwise direction in a spiral of decreasing radius (or, as alternately viewed, wind in a clockwise direction in a spiral of increasing radius from the center) with the turns of the individual coils also being interleaved and spaced apart on the substrate. Alternatively, coils 3 and 5 may be viewed as being clockwise in direction, coil 7 may be viewed as clockwise in direction and coil 9 may be viewed as being counter-clockwise in direction. Since the substrate is electrically insulating in characteristic, the spacing between the individual turns of the coils electrically insulates the coil turns from one another. The dimensions of the coiled coupled microstrip pairs, such as the spacing and trace widths, and number of turns in the coils are chosen to suit the needs of a particular application. It is noted that the coils are formed of rectangular shaped turns. However, those coils may be formed of circular shape, if desired.

Coil 3 to the left in the figure and coil 7 to the right are serially connected, as later herein more fully described, and serve as the primary winding of the balun. Coil 5 to the left and coil 9 to the right serve as the two secondary windings. The start end of coil 3, which also serves as an input for the balun, is represented at 2 and the terminus end of that coil is located at 4. The start end of the corresponding primary coil 7 of the right hand pair of coils is represented at 6, and the terminus end of coil 7, respectively, is represented at 8. The start end of the second coil 5 of the first pair of coils is represented as 12, and the terminus end is represented at 14. The start end of the corresponding coil 9 in the second pair of coils, illustrated to the right, is represented by 16 and the terminus end thereof is represented at 18.

A metal "air bridge" 10, a metal strip which extends over and is electrically insulated from the intervening turns of both pairs of coils, is electrically connected to terminus end 4 of coil 3 and start end 6 of coil 7 to place the two coils electrically in series. Although not visible in the figure the metal air bridge is spaced from the underlying portions of the four coils by a slight gap to avoid any metal-to-metal contact that would create a short circuit to any bridged portion of the four coils. Since the balun may be used in air, which is electrically non-conductive, the gap is referred to as an air gap. However, such is not intended as a limitation, since, as is recognized, the balun may be used as well in any other non-conductive gas atmosphere or in vacuum. Moreover, that air gap may instead be filled with a solid insulator.

A second metal air bridge 20 formed of a metal strip extends over and is spaced from the turns of coils 3 and 5 and electrically connects to terminus end 14 of coil 5. The outer end of that air bridge serves as one output terminal 21 of the balun. A third metal strip 22 forms another air bridge that extends over and is spaced from the turns of coils 7 and 9 and electrically connects to the start end 16 of coil 9. The outer end 23 of the air bridge 22 serves as a second output terminal of the balun. As with the first air bridge described, the spacing electrically insulates the respective bridges from the portions of the respective coils overlain.

As one appreciates the air bridges may also be formed by having the coiled portion overlie the straight output portions 20 and 22 (FIG. 1) and the interconnecting portion 10 connecting the coiled portions 3 and 7 (FIG. 1) of the open circuit transmission line. Alternatively, instead of having one portion elevated over the other portion, as described, it is also possible to have the bridge formed through the substrate 11, a much more complex structure to fabricate, and less preferred. Notwithstanding such changes, It should be recognized that all of the foregoing alternatives come within the scope of the present invention.

The start end 12 of coil 5 and the terminus end 18 of coil 9 are connected together electrically by a metal strip 13 that is attached to the surface of substrate 11. Additionally, a metal pad 15 is formed on the substrate in contact with strip 13 to place the two in common electrical contact. Metal pad 15 constitutes the top metal layer of a via that extends through the substrate for connection to electrical ground potential as illustrated in dotted lines, such as the ground plane layer attached to the substrate.

In alternate embodiments, one may replace pad 15 and the underlying metal via, not illustrated, with two separate vias, along with shortening the length of coiled portions 5 and 9. In such an embodiment, coil portion 5 would be terminated at the same location on the substrate as input end 2, and coil portion 9 would be terminated at the same location on the substrate as end 8 to coil 7. One of the two bonding pads and.vias would then be placed at that end of coil 5 and the other of the two bonding pads and vias would be placed at that end of coil 9. Those ends of coils 5 and 9 would then be connected electrically through the metal grounding layer on the underside of substrate 11. Such an embodiment is less preferred, as it is believed that placing the bonding pads and vias so close to ends 2 and 8, unbalancing the effective quarter-wave coupling length of each coiled pair 3, 5 and 7, 9, would adversely affect the performance of the balun.

Figure 2:
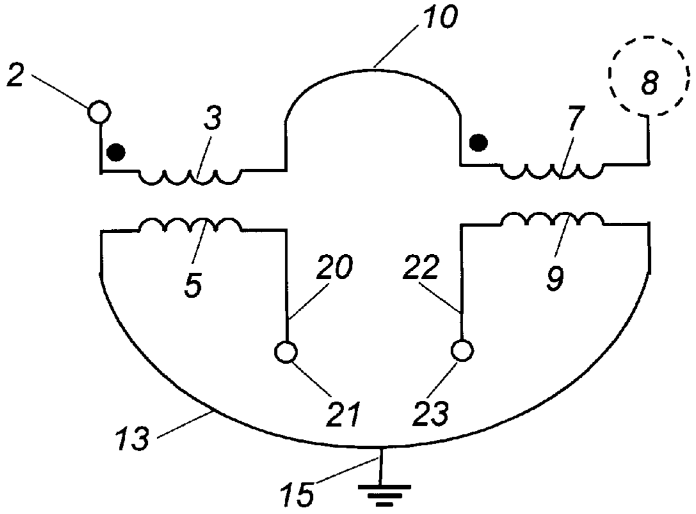
FIG. 2 is a simplified electrical schematic of the embodiment of FIG. 1.

Continuing with the embodiment of FIG. 2, each coil in one coil pair, shown to the left in the figure, is identical in structure with a corresponding coil in the second pair of coils, shown to the right. Except for the opposite radial winding direction, inwardly and outwardly, in other respects coil 3 is identical in the number of turns, length, and width of the metal traces forming the wire of the coil, and so on, with that in coil 7. Likewise, except for the opposite radial winding direction, inwardly and outwardly, coil 5 is identical in the number of tums, length, and width of the metal traces forming the wire of the coil, and so on, with that in coil 9. The entire structure is symmetrical about center-line or axis, an axis of symmetry of the balun. That is, the coiled portions 3 and 5, bridge portions and portion of the straight section of the line connecting coil 5 to pad 15, shown to the left of axis 25 is the mirror image of the corresponding elements of the balun to the right of axis 25.

The foregoing balun is fabricated by depositing the metal windings of the coils on the flat upper surface of a slab or wafer of semiconductor material, as example, a Gallium Arsenide wafer, suitably a 4 mil thick wafer, and depositing a metal layer on the bottom surface using any conventional fabrication technique. Other suitable monolithic semiconductor processes may be substituted for Gallium Arsenide in alternative practical embodiments, as example, Silicon, Silicon Germanium, Indium Phosphide and the like or insulator material such as Alumina. When the metal windings are completed, the air bridges 10, 20 and 22 are formed. The bridges are added to the structure by first adding a Nitride layer on top of the foregoing coils and wafer surface, but leaving the ends 4 and 8, 14 and 18 uncovered by the Nitride, and also leaving holes through to the substrate at the position where the air bridges 20 and 22 are to terminate. Then the metal bridges are deposited on top of the Nitride, and through the depth of the nitride layer, through the holes in the Nitride layer onto the exposed ends 4, 8, 14 and 18, and through the holes in the Nitride to the substrate.

Once the metal bridges are formed, then the Nitride is etched away, using an appropriate etchant. This leaves a physical gap, the air gap, underneath the metal bridge that insulates the metal from the turns of the underlying coil. Opposite ends of each air bridge are supported by short upwardly extending ends that, as appropriate, connect to the ends of the coils as illustrated and to the substrate, suspending the horizontally extending section of metal above the turns of the coil pairs.

FIG. 1, to which reference is made, is a simplified schematic of the balun of FIG. 2. In that simplification, that schematic disregards the self-inductance, capacitance, leakage conductance, and other electrical characteristics inherent in the physical structure of the embodiment of FIG. 2 that influence the performance of the balun, but none the less is helpful to understand the general concept underlying the operation of the new balun. The coupled microstrip transmission lines, which contain coiled portions, are represented in the schematic simply as coils. For ease of description those transmission line portions are referred to as coils. Start end 2 of coil 3 serves as an input that is to be coupled to a source of the high frequency RF signals, the unbalanced line or source. As represented by the solid dot, the start end is the positive polarity end of the coil 3. In operation, the inputted signal propagates serially through coiled lines 3 and 7. The terminus end 8 of coil 7, however, is left open or open circuit. That is, that end is not connected directly to anything else on the substrate, particularly not to any metal circuit elements. Despite that lack of a direct physical connection to ground, high frequency current flows through those windings, just as in an open circuit transmission line that doesn't contain coiled portions.

The input current through coil 3 magnetically couples to winding 5. That current also passes through coil 7 to ground, and magnetically couples to winding 9. Some capacitive coupling may also occur between windings at these high frequencies, depending on the degree of inter-winding capacitance inherent in the structure. Both windings 5 and 9 are connected at an end to juncture 13. That juncture is electrically connected to ground either directly through a via, such as is shown in the figure or indirectly through capacitive coupling of a terminating capacitor, not illustrated in the figure. As example, if the balun is applied in a mixer application in which IF frequency extraction is desired, a shunt terminating capacitor is connected in the balun between the juncture location and ground instead of the metal via.

The current through winding 3 passes from the positive polarity end of the coil to the negative end, and passes in the reverse direction through coil 7, from the negative end of coil 7 to the positive end of coil 7. That current induces oppositely phased currents in the respective windings of coils 5 and 9, which are themselves in opposite electrical phase relative to one another. Since both windings 5 and 9 are identical, the induced currents across windings 5 and 9, ideally, are equal in magnitude. Preferably, the electrical length of coiled pair 3 and 5 and that same combined electrical length of coiled pair 7 and 9 are each one-quarter wavelength, $\lambda/4$, at the center frequency of the frequency band at which the balun is intended to be used. It is again noted that the simplified schematic of FIG. 2 does not take into account the additional complexities in the actual physical structure as may be introduced, as example, by inter-winding capacitance and the like, which will affect the results obtained from the Balun. Because one end of the transmission line containing coil portions 3 and 7 is open circuited, a characteristic of Marchand couplers, the present balun may be considered a Marchand type balun.

However, the results proved exceptional. The RF characteristics and performance of a physical structure is customarily obtained initially by computer through use of a computer simulation program, such as any of the known simulation programs. As example, one known program is the em program available from Sonnet Software, Inc. a 2.5D simulation program which is based on the application of Maxwell's Equations to planar structures in a method commonly referred to as the "Method of Moments" (MoM). Another is the Ensemble program available from Ansoft Corporation, a 2.5D field solver, similar to Sonnet's program and also based on Maxwells' equations. And still another is the HFSS program, also available from Ansoft Corporation, a 3D fullwave electromagnetic field solver. Theoretically, the HFSS program is based on the application of Maxwell's equations to full three dimensional structure using a method commonly known as the Finite Element Method. Such simulation programs permit one to quickly determine the RF characteristics of a structure based on the iterative synthesis and arrangement of its geometry and materials.

Figures 3, 4:
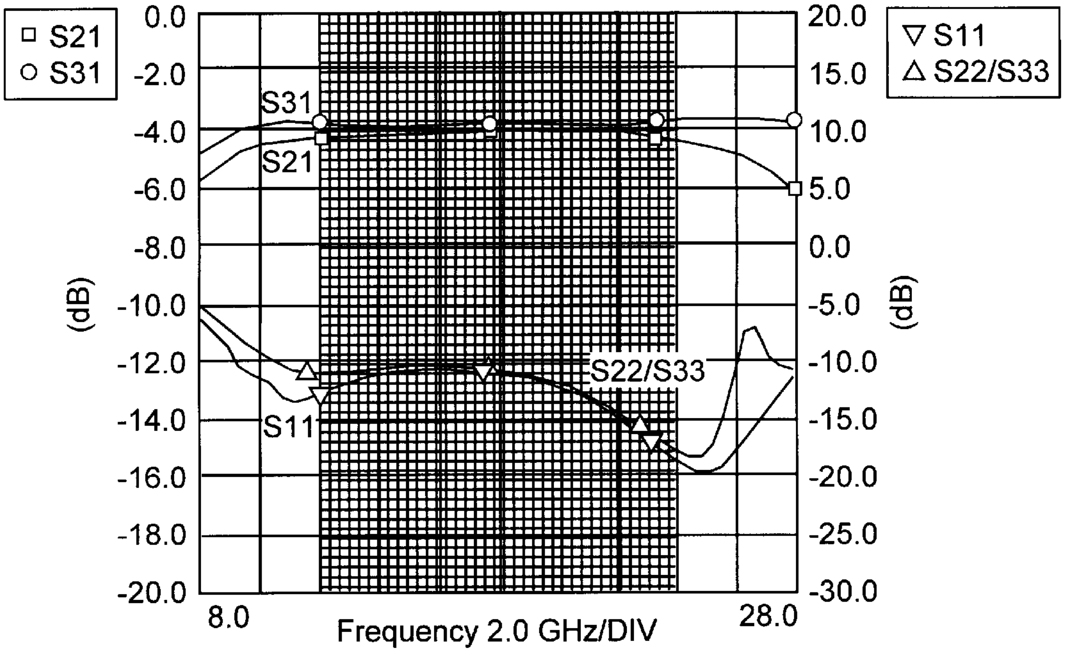
FIG. 3 is a graph illustrating the results obtained from the embodiment of FIG. 1 in operation.
FIG. 4 is a chart tabulating the relative phase and magnitude of the output power ratios between the balanced outputs of the balun of FIG. 1 as a function of frequency.

The results obtained from a computer simulation of the foregoing structure are plotted and charted, respectively, in FIGS. 3 and 4. As shown it is found that the output from one of the windings 5 (S31) is nearly equal throughout a good portion of the 8.0 to 28.0 GHz frequency range with the output obtained from the other winding 9 (S21), yielding an excellent balance in magnitude. FIG. 4 tabulates the difference in magnitude between the two output ports, and that difference is less than 0.65 dB over the 12 to 24 GHz frequency band, an octave bandwidth. Also the balanced output power ratios of S21 and S31 are essentially flat over the range of 12 GHz to 24 GHz. The standing wave ratios S22 and S33 are essentially equal and display an excellent impedance match to the reference impedance over that same range. Effectively thus, the structure produces a balun that is ultra wideband in characteristic. The relative phase of the RF power ratios between the outputs 21 and 23 is illustrated in the chart of FIG. 4 to which reference is made. As shown, as the frequency increases from 12 to 24 GHz, the relative phase is very close to the ideal of 180 degrees, varying from 178.97 degrees at 12 GHz to 185.43 degrees at 24 GHz. Such results are considered outstanding.

As earlier noted in some mixer applications to which the balun is applied, it may become necessary to extract a so-called "mixed" frequency or intermediate frequency (IF). Extraction of that frequency component from the balun of FIGS. 1 and 2 is accomplished by removing the via to ground, such as illustrated by the dash line from pad 15 to ground in FIGS. 1 and 2, and replacing that ground via with a high frequency equivalent grounding mechanism. The equivalent grounding mechanism often used for that function is a shunt capacitor with the capacitor having one end connected to the electrical location of the pad and the other end thereof connected to ground. The optimal value of the capacitor depends on the particular requirements of the extracted mixed frequency and may be determined through calculation or simulation known to those skilled in the art. Typically, that value measures in pico-farads at GHz frequencies.

At the high RF frequency input to such mixer containing the balun, the shunt capacitor provides a low impedance path for the RF to pass to ground. However, at the IF frequency, which is substantially lower than the foregoing RF frequency, the effective impedance of that capacitance is much larger. Hence, a larger AC voltage (e.g. voltage drop) of the IF signals is produced across the shunt capacitor. That voltage can be routed as required by the mixer circuits.

It should be appreciated that the balun coupler with the shunt capacitance to ground functions essentially in the same way as one with the direct connection to ground. The performance of the balun obtained with the capacitance to ground in place is not significantly different from the performance described in FIGS. 3 and 4 for the balun having electrical juncture 13 (e.g. pad 15) directly grounded. For all practical purposes the performance is the same.

The foregoing shunt capacitor may be formed on the semiconductor wafer, such as in the practical example a wafer of Gallium Arsenide, a relatively high dielectric material, by a square shaped metal coating or deposit defining a capacitor plate on the upper surface of the substrate that is in electrical contact with winding ends 12 and 18 of FIG. 1. The foregoing plate may electromagnetically interact with the metal ground plane layer, not illustrated, located on the underside of the dielectric substrate 11 or a with a metal support plate. Either of those alternatives provides the second metal plate, spaced. by a dielectric material from the formed capacitor plate, necessary to define a capacitor.

At lower frequencies than those for which the preceding embodiments of FIGS. 1 and 2 were designed, the length of the coil windings needs to be increased. Theoretically, the length of the winding should be equal in electrical length to one-quarter the wavelength of the center frequency of the frequency band at which the balun is intended to be used to evenly split RF signals. Thus, a balun coupler intended to operate at the 3 to 6 GHz frequency band possesses the physical appearance in top view illustrated in FIG. 5, to which reference is made.

Figure 5:
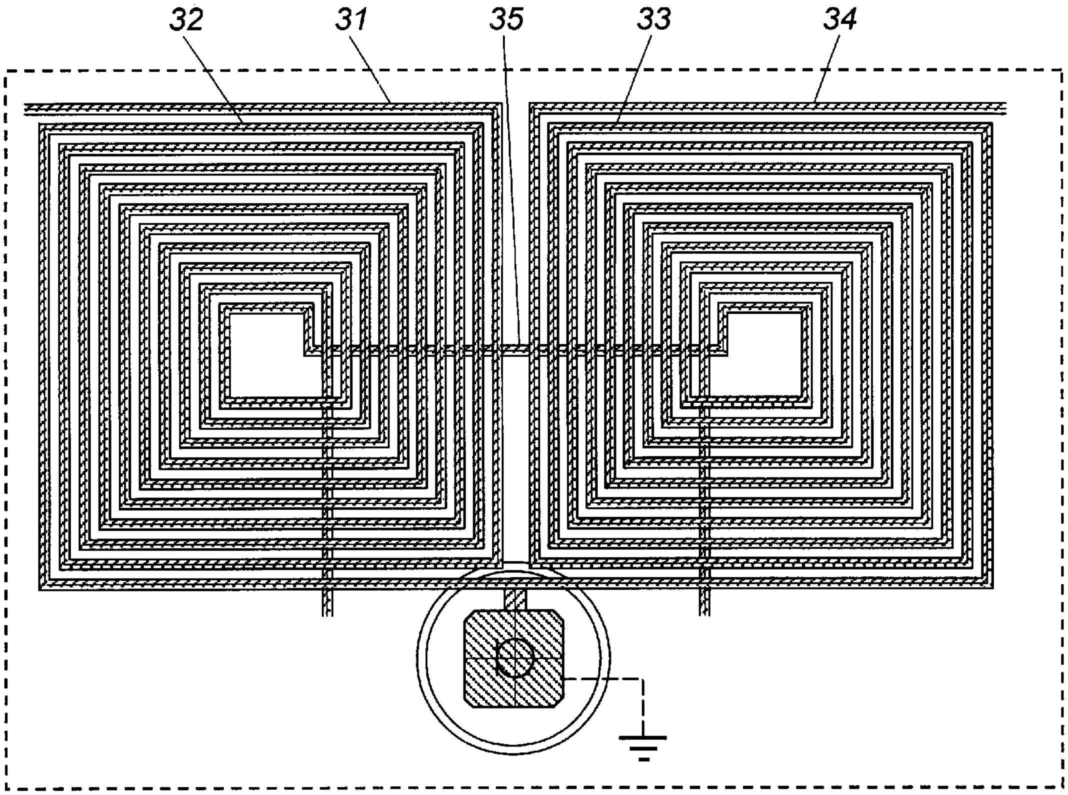
FIGS. 5 and 6 illustrate the embodiments of FIG. 1, respectively, as constructed for operation in two different frequency ranges.

The interleaved windings 31 and 32 and interleaved windings 33 and 34 are seen to be greater in length and occupy a slightly larger physical area, than the corresponding embodiment of FIG. 1. The bridge 35 is therefore of greater length than the corresponding element 10 in FIG. 1, due to the greater physical distance spanning the ends of coils 32 and 33. The operation of the coupler of FIG. 5 is the same as described for that of FIG. 1, and need not be repeated. As in the prior embodiment it is found that even in this lower frequency range the planar structure provides an essentially balanced output over an ultra-wide frequency range.

Figure 6:
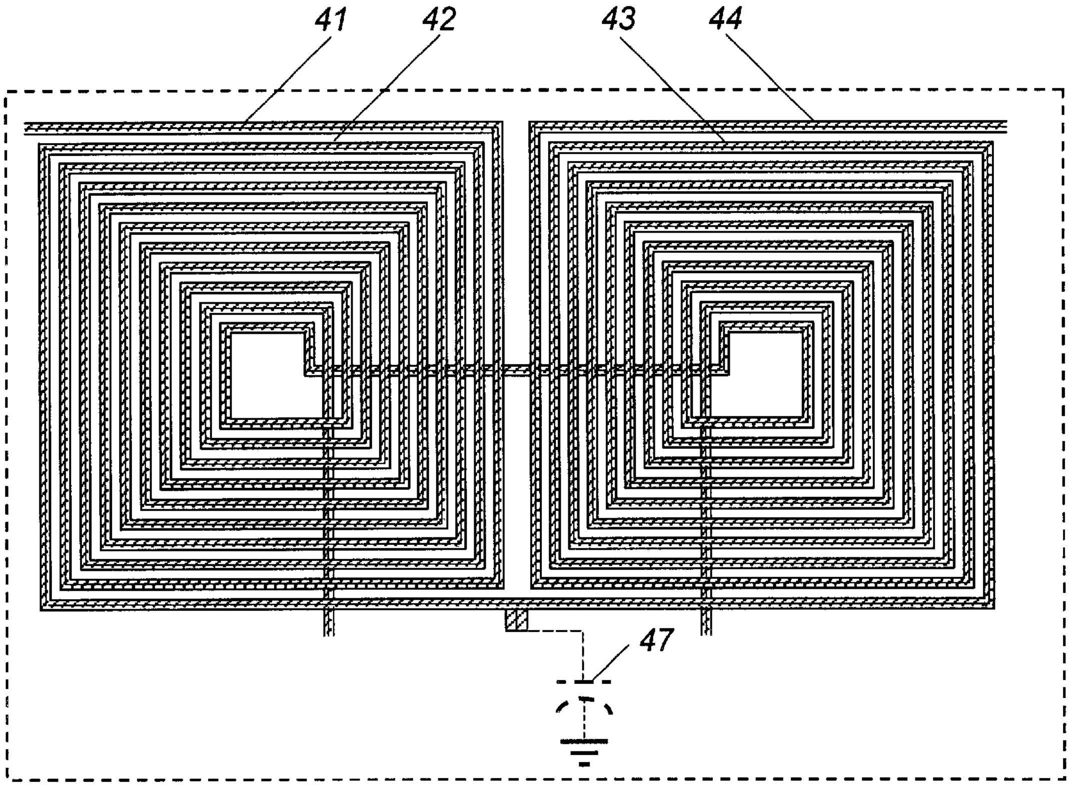

For completeness, FIG. 6 illustrates in top view the balun of FIG. 5 that is designed to serve as the balun within a high frequency up-converter device, not illustrated. For that un-converter device, the balun, hence, uses a shunt capacitance at the juncture of the two halves of the secondary winding of the balun in lieu of a direct connection to ground as in the balun of FIG. 5. This balun contains coils 41–44 connected as illustrated and capacitor 47. The balun is fabricated in the same way as the preceding embodiments, operates as a passive circuit device in the same manner as the preceding embodiments, and enjoys the same ultra-wide band result.

The coiled portions used in the foregoing balun embodiments contain a whole number of turns. As is recognized, other embodiments may contain a fractional number of turns. As example, an additional embodiment of the invention, not illustrated, contained coils formed of one and one-half turns. Analysis of the balun formed with those fractional turn coiled portions with the computer simulation programs showed that the functional characteristic of the balun remained essentially unchanged from that presented herein.

The balun of the invention should be recognized as a unique form or implementation of a Marchand balun that is particularly suited for application in MMIC and other printed circuit devices. The foregoing Balun structure may be manufactured using only a single layer substrate, unlike those prior Baluns that require multiple layers of substrate to build up a three dimensional structure. Hence, the invention offers relative manufacturing simplicity, and, hence, a lower manufacturing cost. More importantly, the new Balun structure achieves highly desirable results. As those skilled in the art recognize, the foregoing Balun has application as a component in frequency mixer apparatus, in frequency upconverters, and frequency downconverters, and as a component of other RF devices.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A planar balun comprising:

a substrate of semiconductor material, said substrate having flat top and bottom surfaces;

a metal ground plane layer, said metal ground plane layer covering said bottom surface of said substrate;

a first coil pancake and second coil pancake formed in side by side relationship on said flat upper surface of said substrate;

said first coil pancake comprising a first pair of interleaved spiral coils in magnetically coupled relationship, and said second coil pancake comprising a second pair of interleaved spiral coils, each of said coils in each of said pairs of spiral coils having first and second ends;

said first coil pair defining a spiral of decreasing radius and said second coil pair defining a spiral of increasing radius and said first coil pair comprising a mirror image of said second coil pair;

said first end of said first spiral coil of said first pair defining a balun input;

said second end of said first spiral coil of said first pair and said first end of said second spiral coil of said second pair being connected electrically in common; and said second end of said second spiral coil of said second pair being an open circuit, wherein said first spiral coil of said first pair and said second spiral coil of said second pair define an open circuit transmission line;

a first end of said second coil of said first pair defining a first balun output;

said second end of said first coil of said second pair defining a second balun output; and said second end of said second coil of said first pair and said first end of said first coil of said second pair being electrically connected together.

2. The planar balun as defined in claim 1, further comprising a metal pad on said substrate, said metal pad being connected to said electrical connection between said second end of said second coil of said first pair and said first end of said first coil of said second pair.

3. The planar balun as defined in claim 1, wherein said substrate includes a metal via, said via extending between said upper side and said bottom side of said substrate for electrically connecting said metal pad to said metal ground plane layer and further comprising: a capacitor, said capacitor having one side electrically connected to said electrical connection between said second end of said second coil of said first pair and said first end of said first coil of said second pair.

4. The planar balun as defined in claim 3 wherein said remaining side of said capacitor is electrically connected to said ground plane.

5. A balun for transforming an unbalanced signal of wavelength λ into a pair of balanced signals of said wavelength, comprising:

a balun input;

a first balun output;

a second balun output;

a substrate of electrically non-conductive or semiconductive material, said substrate having a relatively flat upper surface, a relatively flat bottom surface and a predetermined thickness, and said flat upper surface containing front, rear and right and left side edges;

said first and second balun outputs being positioned facing the same side edge of said substrate;

a metal layer attached to and covering said bottom surface of said substrate;

said first and second balun output being located adjacent one another along said rear edge of said substrate;

first and second planar metal rectangular spirals defining a first coil pair, said first and second planar metal spirals each being attached to said flat substrate surface and having first and second ends;

said first and second planar metal spirals being interleaved, spaced from one another to prevent electrical contact there between and magnetically coupled with one another;

each of said first and second planar metal spirals defining a planar coil having an electrical length of about one-quarter of said λ and defining a spiral of decreasing radius in one clockwise direction;

third and fourth planar metal rectangular spirals defining a second coil pair, said third and fourth planar metal spirals each being attached to said flat substrate surface and having first and second ends;

said third and fourth planar metal spirals being interleaved, spaced from one another to prevent electrical contact there between, and magnetically coupled with one another;

each of said third and fourth planar metal rectangular spirals defining a planar coil having an electrical length of about one-quarter of said λ and defining a spiral of increasing radius in said one clockwise direction;

said first coil pair and said second coil pair being positioned adjacent one another at separate spaced locations on said flat substrate surface;

said first and second planar metal rectangular spirals being a mirror image of said third and fourth planar metal rectangular spirals;

a first metal strip defining a first air bridge, said first metal strip extending from one of said first and second ends of said first metal rectangular spiral to one of said first and second ends of said fourth metal rectangular spiral common to place said first and fourth metal rectangular spirals electrically in series, said first metal strip extending over and physically spaced from portions of said first, second, third and fourth metal rectangular spirals positioned between said one end of said first metal rectangular spiral and said one end of said third metal rectangular spiral to electrically insulate said first metal strip from intervening portions of said first, second, third and fourth metal rectangular spirals and define a first air gap there between;

a second metal strip defining a second air bridge, said second metal strip air bridge extending from one of said first and second ends of said second metal rectangular spiral to said first balun output, said second metal strip extending over and physically spaced from portions of said first and second metal rectangular spirals positioned between said one end of said second metal rectangular spiral and said first balun output to electrically insulate said second metal strip from intervening portions of said first and second metal rectangular spirals and define a second air gap there between;

a third metal strip defining a third air bridge, said third metal strip extending from one of said first and second ends of said third metal rectangular spiral to said second balun output, said third metal strip extending over and physically spaced from portions of said third and fourth metal rectangular spirals positioned between said one end of said third metal spiral and said second balun output to electrically insulate said third metal strip from intervening portions of said third and fourth metal spirals and define a third air gap there between;

a fourth metal strip connecting the other one of said first and second ends of said second metal rectangular spiral to the other one of said first and second ends of said third metal rectangular spiral to provide a common juncture to said second and third metal rectangular spirals, said fourth metal strip being attached to said flat substrate surface;

said balun input connected to the other one of said first and second ends of said first metal rectangular spiral for inputting unbalanced signals to said first metal rectangular spiral;

said other one of said first and second ends of said fourth metal rectangular spiral being positioned in spaced relationship to any metal material on said flat substrate surface to define an open end to said fourth metal rectangular spiral;

said first, second and third air gaps being sufficiently great to preclude electrical arcing; said metal strips and all said metal rectangular spirals each comprising a planar geometry; said electrically non-conductive or semiconductive substrate comprising a material selected from the group consisting of: Gallium Arsenide, Indium Phosphide, Silicon Germanium, Silicon and Alumina; and each of said second and fourth metal rectangular strips being of one-quarter λ in overall electrical length.

6. The balun as defined in claim 5, further comprising: a capacitor, said capacitor having an end electrically connected to said common juncture for providing an AC path between said common juncture and ground.

7. A coupled line balun for use at a wavelength, λ, comprising:

a substrate of dielectric material, said substrate being relatively flat and possessing an upper surface and bottom surface;

a metal layer attached to and covering said bottom surface;

a first planar transmission line attached to and extending along said upper surface, said first planar transmission line being an open circuit transmission line and defining first and second coil portions, each of said first and second coil portions being substantially identical in geometry and of an electrical length of one-quarter λ;

a second and third planar transmission lines attached to said upper surface, said second and third planar transmission lines being respectively magnetically coupled to said first planar transmission line; each of said second and third planar transmission lines having first and second ends and a coiled portion of an electrical length of one-quarter λ;

said coiled portion of said second planar transmission line being interleaved with said first coil portion of said first transmission line to magnetically couple said coiled portion and said first coil portion; and said coiled portion of said third planar transmission line being interleaved with said second coil portion of said first transmission line to magnetically couple said coiled portion and said second coil portion;

said first end of said second and third planar transmission lines being electrically connected in common;

said second end of each of said second and third planar transmission lines providing respective output ports of said balun;

whereby a signal of wavelength, λ, applied to the input of said first planar transmission line appears in essentially equal magnitude at each of said second ends of said second and third planar transmission lines and in essentially opposite phase.

8. The coupled line balun as defined in claim 7, wherein said upper surface of said substrate includes front and rear edges; and wherein said second end of each of said second and third planar transmission lines faces one of said front and rear edges whereby said output ports are located at the same edge of said substrate.

9. The coupled line balun as defined in claim 8, wherein said electrical connection between said first end of each of said second and third planar transmission lines is formed at a juncture, said juncture being positioned symmetrically of said coiled portions of each of said first and second planar transmission lines and further comprising: a metal via, said metal via extending from said upper surface of said substrate through said substrate and into contact with said metal layer; a capacitor located on said upper surface of said substrate, said capacitor having a terminal connected to said juncture and a second terminal connected to said metal via.

10. The coupled line balun as defined in claim 8, wherein said electrical connection between said first end of each of said second and third planar transmission lines is formed at a juncture, said juncture being positioned symmetrically of said coiled portions of each of said first and second planar transmission lines and further comprising: a metal via, said metal via being in contact with said juncture and extending from said upper surface of said substrate through said substrate and into contact with said metal layer.

11. The coupled line balun as defined in claim 7, wherein said coil portion of said second planar transmission line comprises a curved metal trace defining a circular spiral of reducing diameter that spirals in one of either a clockwise or clockwise direction and wherein said coil portion of said third planar transmission line comprises a curved metal trace defining a circular spiral of reducing diameter that spirals in a direction opposite to the direction of spiral of said coil portion of said second planar transmission line.

12. The coupled line balun as defined in claim 7, wherein said coil portion of said second planar transmission line comprises a curved metal trace defining a rectangular spiral of reducing diameter that spirals in one of either a clockwise or clockwise direction and wherein said coil portion of said third planar transmission line comprises a curved metal trace defining a rectangular spiral of reducing diameter that spirals in a direction opposite to the direction of spiral of said coil portion of said second planar transmission line.

13. A balun, comprising:

a balun input;

a first balun output;

a second balun output;

a substrate of electrically non-conductive or semiconductive material, said substrate having a flat substrate surface and being of predetermined thickness;

first and second planar metal spirals defining a first coil pair, said first and second metal spirals each being attached to said flat substrate surface and having first and second ends, said first and second metal spirals being interleaved and spaced from one another to prevent electrical contact there between, and each of said first and second metal spirals defining a planar coil having at least a single turn and defining a spiral of decreasing radii in one clockwise direction;

third and fourth planar metal spirals defining a second coil pair, said third and fourth planar metal spirals each being attached to said flat substrate surface and having first and second ends, said first and second metal spirals being interleaved and spaced from one another to prevent electrical contact there between, and each of said third and fourth metal spirals defining a planar coil having at least a single turn and defining a spiral of increasing radii in said one clockwise direction;

said first coil pair and said second coil pair being positioned adjacent one another at separate spaced locations on said flat substrate surface;

a first metal strip defining a first air bridge, said first metal strip extending from one of said first and second ends of said first metal spiral to one of said first and second ends of said fourth metal spiral to place said first and fourth metal spirals electrically in series, said first metal strip extending over and physically spaced from portions of said first, second, third and fourth metal spirals intervening between said one end of said first metal spiral and said one end of said third metal spiral to electrically insulate said first metal strip from said intervening portions of said first, second, third and fourth metal spirals and define a first air gap there between;

a second metal strip defining a second air bridge, said second metal strip air bridge extending from one of said first and second ends of said second metal spiral to said first balun output, said second metal strip extending over and physically spaced from portions of said first and second metal spirals intervening between said one end of said second metal spiral and said first balun output to electrically insulate said second metal strip from said intervening portions of said first and second metal spirals and define a second air gap there between;

a third metal strip defining a third air bridge, said third metal strip extending from one of said first and second ends of said third metal spiral to said second balun output, said third metal strip extending over and physically spaced from portions of said third and fourth metal spirals intervening between said one end of said third metal spiral and said second balun output to electrically insulate said third metal strip from said intervening portions of said third and fourth metal spirals and define a third air gap there between;

a fourth metal strip connecting the other one of said first and second ends of said second metal spiral to the other one of said first and second ends of said third metal spiral to provide a common juncture to said second and third metal spirals, said fourth metal strip being attached to said flat substrate surface;

said balun input connected to the other one of said first and second ends of said first metal spiral for inputting unbalanced signals to said first metal spiral; and said other one of said first and second ends of said fourth metal spiral being positioned in spaced relationship to any metal material on said flat substrate surface to define an open end to said fourth metal spiral.

14. The balun as defined in claim 13, further comprising: a ground ring of electrically conductive material, said ground ring extending about the upper surface of said substrate and defining a ring about said first and second coil pairs.

15. The balun as defined in claim 13, further comprising: a capacitor, said capacitor having one side connected electrically to said common juncture.

16. The balun as defined in claim 15, further comprising: a ground plane, said ground plane underlying said substrate; and wherein a remaining side of said capacitor is electrically connected to said ground plane.

17. The balun as defined in claim 13, wherein said electrically non-conductive or semiconductive material is selected from the group consisting of Gallium Arsenide, Indium Phosphide, Silicon Germanium, Silicon, and Alumina.

* * * * *